(12) United States Patent
Chen et al.

(10) Patent No.: US 11,183,398 B2
(45) Date of Patent: Nov. 23, 2021

(54) RUTHENIUM HARD MASK PROCESS

(71) Applicant: Tokyo Electron Limited, Tokyo (JP)

(72) Inventors: Zhiying Chen, Austin, TX (US); Alok Ranjan, Austin, TX (US); Peter Ventzek, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/407,272

(22) Filed: May 9, 2019

(65) Prior Publication Data

US 2020/0051833 A1 Feb. 13, 2020

Related U.S. Application Data

(60) Provisional application No. 62/717,089, filed on Aug. 10, 2018, provisional application No. 62/736,529, filed on Sep. 26, 2018.

(51) Int. Cl.
*H01L 21/321* (2006.01)
*H01L 21/3213* (2006.01)
*H01L 21/033* (2006.01)
*H01L 21/3065* (2006.01)

(52) U.S. Cl.
CPC .... *H01L 21/32139* (2013.01); *H01L 21/0332* (2013.01); *H01L 21/3065* (2013.01)

(58) Field of Classification Search
CPC ........... H01L 21/32139; H01L 21/0332; H01L 21/3065; H01L 21/32136
USPC .................................................. 438/706–725
See application file for complete search history.

(56) References Cited

U.S. PATENT DOCUMENTS

| 5,750,290 | A | 5/1998 | Yasuzato et al. |
| 6,277,760 | B1* | 8/2001 | Lee .................. H01L 21/31122 257/E21.009 |
| 8,377,318 | B2* | 2/2013 | Yamamoto ............. H01L 27/22 216/22 |
| 2004/0102041 | A1* | 5/2004 | Okudaira .......... H01L 21/32139 438/689 |
| 2004/0121593 | A1 | 6/2004 | Matsunuma |
| 2012/0187546 | A1 | 7/2012 | Akinmade-Yusuff et al. |

(Continued)

FOREIGN PATENT DOCUMENTS

KR 10-2009-0022809 A 3/2009

OTHER PUBLICATIONS

Translation of Yohei et al, JP2003059905A (Year: 2003).*

(Continued)

*Primary Examiner* — Duy Vu N Deo
(74) *Attorney, Agent, or Firm* — Oblon, McClelland, Maier & Neustadt, L.L.P.

(57) ABSTRACT

A process is provided in which a hard mask material comprising ruthenium is used. Ruthenium provides a hard mask material that is etch resistant to many of the plasma chemistries typically used for processing substrate patterning layers, including layers such as, for example, nitrides, oxides, anti-reflective coating (ARC) materials, etc. Further, ruthenium may be removed by plasma chemistries that do not remove nitrides, oxides, ARC materials, etc. For example, ruthenium may be easily removed through the use of an oxygen (O2) plasma. Further, ruthenium may be deposited as a thin planar 10 nm order film over oxides and nitrides and may be deposited as a planar layer.

21 Claims, 7 Drawing Sheets

(56) References Cited

U.S. PATENT DOCUMENTS

2013/0320539 A1   12/2013   Wang et al.

OTHER PUBLICATIONS

Translation of KR20090022809A (Year: 2009).*
Korean Intellectual Property Office, The International Search Report and the Written Opinion for International application No. PCT/US2019/045105, dated Nov. 25, 2019, 12 pg.
International Preliminary Report on Patentability and Written Opinion dated Feb. 25, 2021 in PCT/US2019/045105.

\* cited by examiner

RUTHENIUM HARD MASK PROCESS

This application claims priority to U.S. Provisional Patent Application No. 62/717,089, entitled, "Ruthenium Hard Mask Process," filed Aug. 10, 2018, and U.S. Provisional Patent Application No. 62/736,529, entitled "Ruthenium Hard Mask Process," filed on Sep. 26, 2018; the disclosures of which is expressly incorporated herein, in their entirety, by reference.

BACKGROUND

The present disclosure relates to the processing of substrates. In particular, it provides a method for patterning of substrates.

As critical dimensions of features formed on substrates continue to shrink, patterning techniques often require masking layers with increased etch resistance while minimizing thickness to lessen aspect ratio dependency effects. These problems are arise at a variety of front end of line (FEOL) and back end of line (BEOL) process steps, but are particularly problematic for small geometry structures at a back end of line processing point process point. In order to assist in such issues, patterning processes often now utilize hard masks in addition to traditional photoresists or other patterning layers. Thus, for example, whether a process is a traditional 193 nm patterning process, an extreme ultraviolet (EUV) lithography process, multiple patterning process, direct self-assembly (DSA) process or other advanced patterning technique, often a hard mask layer may be utilized under another patterning layer (such as a photoresist layer), to assist in the pattern transfer process. A variety of hard mask layers are known including, for example, silicon oxide layers, silicon nitride layers, titanium based layers and others. However, the thicknesses required for such hard mask layers create aspect ratio dependent etch issues. Other materials such as hafnium oxide (HfO2) may provide etch resistance such that thin layers may be used. However, such materials have been found to have removal constraints that make such materials unsuitable for many hard mask implementations. Therefore, as critical dimensions continue to shrink, the use of hard mask layers has become challenging. Specifically, the appropriate balance of etch resistance to various etches, removability, required thickness and compatibility with other steps and materials has become challenging.

Thus, it would be desirable to utilize a more robust hard mask layer in conjunction with substrate patterning that provides improved performance to accommodate shrinking critical dimensions.

SUMMARY

In one embodiment, a process is provided in which a hard mask material comprising ruthenium is used. Ruthenium provides a hard mask material that is etch resistant to many of the plasma chemistries typically used for processing substrate patterning layers, including layers such as, for example, nitrides, oxides, anti-reflective coating (ARC) materials, etc. Further, ruthenium may be removed by plasma chemistries that do not remove nitrides, oxides, ARC materials, etc. For example, ruthenium may be easily removed through the use of an oxygen (O2) plasma. Further, ruthenium may be deposited as a thin planar 10 nm order film over oxides and nitrides and may be deposited as a planar layer.

In one embodiment, a method of etching a substrate is provided. The method may comprise providing a target etch layer on the substrate and providing a patterned layer overlying the target etch layer. The method further comprises providing a hard mask layer comprising ruthenium between the target etch layer and the patterned layer. The method further comprises etching a pattern of the patterned layer into the hard mask layer to form a patterned hard mask layer. The method further comprises etching the target etch layer while utilizing the patterned hard mask layer as a masking layer for the etching of the target etch layer.

In another embodiment, a method of patterning a first layer of a substrate is provided. The method comprises providing a patterned photoresist layer on the substrate; providing the first layer on the substrate; and providing a hard mask layer comprising ruthenium between the patterned photoresist layer and the first layer. The method further comprises transferring a pattern of the patterned photoresist layer into the hard mask layer to form a patterned hard mask layer and transferring a pattern of the patterned hard mask layer to the first layer after forming the patterned hard mask layer. The method also comprises removing the patterned hard mask layer after transferring a pattern of the patterned hard mask layer to the first layer.

In yet another embodiment, a method of etching a substrate is provided. The method may comprise providing a target etch layer on the substrate, providing a patterned layer overlying the target etch layer, and providing a ruthenium hard mask layer comprising ruthenium between the target etch layer and the patterned layer. The method further comprises etching a pattern of the patterned layer into the ruthenium hard mask layer to form a patterned ruthenium hard mask layer by utilizing a plasma comprising oxygen and etching the target etch layer while utilizing the patterned ruthenium hard mask layer as a masking layer for the etching of the target etch layer. After etching the target etch layer, the method comprises removing the patterned ruthenium hard mask layer utilizing a plasma comprising oxygen.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

In one embodiment, a process is provided in which a hard mask material comprising ruthenium is used. Ruthenium provides a hard mask material that is etch resistant to many of the plasma chemistries typically used for processing substrate patterning layers, including layers such as, for example, nitrides, oxides, ARC materials, etc. Further, ruthenium may be removed by plasma chemistries that do not remove nitrides, oxides, ARC materials, etc. For example, ruthenium may be easily removed through the use of an oxygen (O2) plasma. Further, ruthenium may be deposited as a thin planar 10 nm order film over oxides and nitrides and may be deposited as a planar layer.

Figure 1:
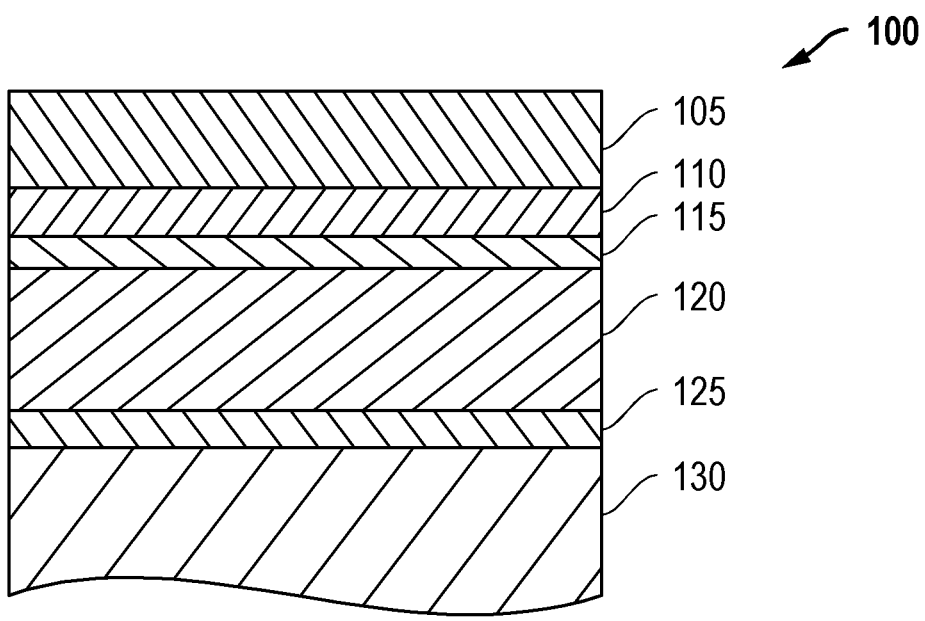
FIGS. 1-7 illustrate an exemplary substrate process flow utilizing a ruthenium hard mask layer.

FIGS. 1-7 illustrate an exemplary process flow for utilizing the ruthenium hard mask techniques described herein. It will be recognized that the process flow and the layers shown in FIG. 1-7 are merely exemplary and that a ruthenium hard mask may be utilized in many other process flows utilizing a wide variety of other layers and/or combinations of layers. In the example of FIG. 1, a substrate 100 is provided.

The substrate may include a photoresist layer 105. It will be recognized that alternatively, other patterning layers may be used however. Underlying photoresist layer 105 is an anti-reflective layer, for example, a bottom anti-reflective coating (BARC) layer 110. BARC layer 110 may be formed of any of a wide variety of BARC materials including organic and inorganic materials as is known in the art. In an exemplary embodiment the BARC material may be an organic or inorganic anti-reflective coating (ARC) material. Organic ARCs may be spin carbon-based materials whose properties are tailored to minimize undesired reflections during exposure. They are typically etched using fluorocarbon (e.g. CF4) or oxygen, nitrogen, hydrogen based chemistries. Inorganic ARC materials range from SiN, SiON, caroboxynitrides, TiO or other combinations. They may be graded in composition through their thickness. They are etched primarily using fluorocarbon plasma chemistries such as CF4, CHF3 and inert gases and O2. Both inorganic and organic ARCs are useful as they may be etched with fluorocarbon-based plasmas that do not etch ruthenium. Inorganic ARCs (such as for example silicon carbide, silicon nitride, silicon oxynitride, or silicon oxycarbide) may be preferred as the gases used to etch ruthenium which will not disturb the ARC layer that serves as a mask for Ru. Underlying the BARC layer 110 is a ruthenium hard mask layer 115. In one exemplary embodiment, the ruthenium hard mask layer 115 may be less than 20 nm thick and more preferably less 15 nm thick. In one embodiment the ruthenium hard mask layer 115 may be in a range of 5 to 20 nm and even more preferably 10 nm thick. Underlying the ruthenium hard mask layer 115 is the target etch layer 120 (the layer which is ultimately desired to be etched). The target etch layer 120 may be comprised of any of a wide range of materials. In one exemplary embodiment, the target etch layer 120 may comprise silicon in the case of logic structure fabrication, silicon dioxide or silicon nitride in the case of contact, memory and multiple patterning applications or ultra-low dielectric constant materials in the case of interconnect applications. An etch stop layer 125 may also be provided as shown. In one exemplary embodiment, the etch stop layer 125 may comprise silicon nitride in the case of silicon or silicon dioxide patterning. Other underlying layer(s) 130 may also be optionally provided.

Substrate 100 may be any substrate for which the use of patterned features is desirable. For example, in one embodiment, substrate 100 may be a semiconductor substrate, for example, a semiconductor wafer having one or more semiconductor processing layers formed thereon. In one embodiment, the substrate 100 may be a substrate that has been subject to multiple semiconductor processing steps which yield a wide variety of structures and layers, all of which are known in the substrate processing art. Thus, it will be recognized that underlying layer(s) 130 may include a wide variety of structures and layers, as known in the art. In one embodiment, the substrate 100 provided in FIG. 1 may be a substrate at a back end of line (BEOL) process point of a semiconductor wafer processing flow. However, the techniques described may also be utilized at front end of line (FEOL) process steps. It will be recognized that the stack of layers shown in FIG. 1 is merely exemplary and the materials described merely exemplary. Further, more or less layers may be utilized as the example of FIG. 1 is not meant to be limiting. For example, more or less layers may be provided as compared to those shown. Further, the order of the various layers may be changed, all as would be recognized by those skilled in the art.

Figure 2:
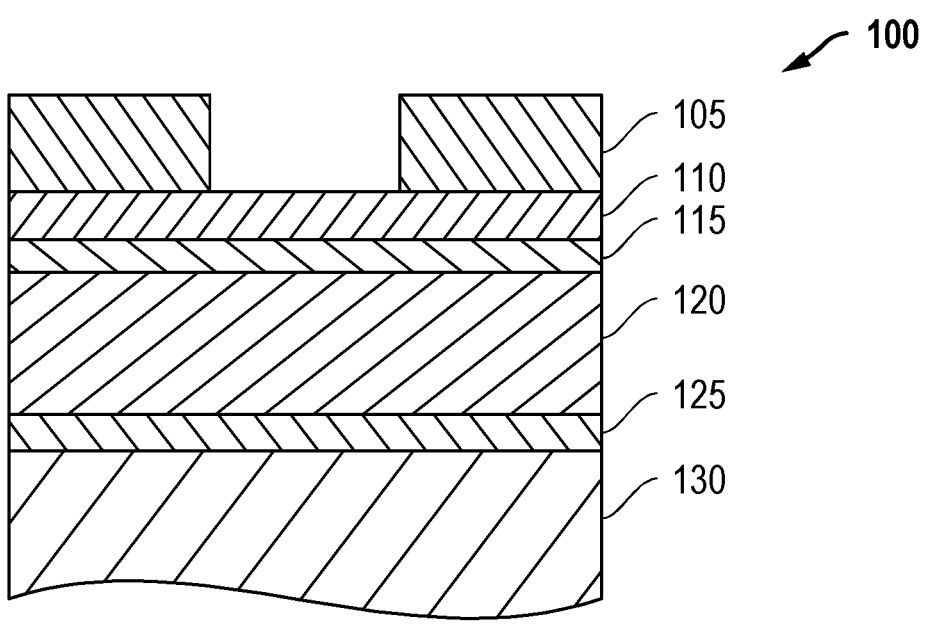

After providing a substrate such as shown in FIG. 1, the substrate 100 may be patterned (for example through a photolithography process) such that photoresist layer 105 may have a pattern as shown in FIG. 2. As described below, the pattern of the photoresist layer 105 may be transferred to various underlying layers using etch techniques.

Figure 3:
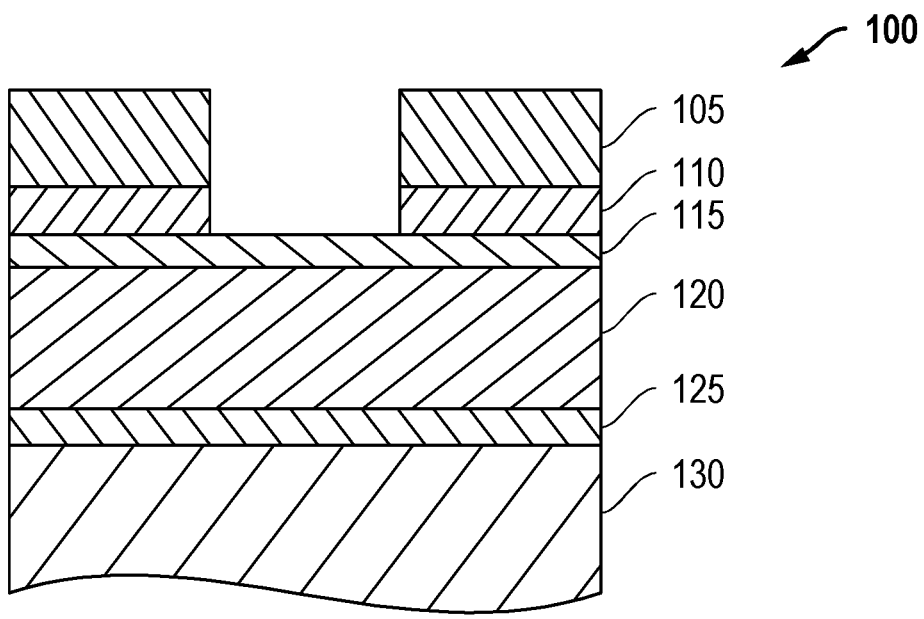

Processing may then continue through the use of an etch which etches the BARC layer 110 as shown in FIG. 3.

Figure 4:
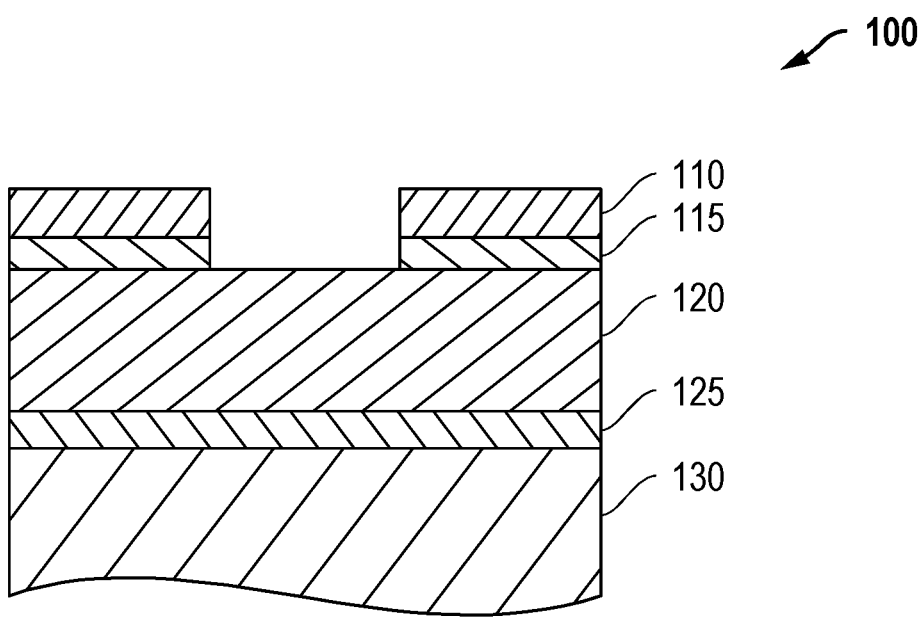

In one embodiment, the BARC etch may be a plasma etch. For example, the BARC etch may be a N2/H2 based plasma etch or a fluorocarbon (CxFy) based plasma etch. However, other etches may be used and the particular etch may depend upon the particular BARC material utilized. Next processing may continue as shown in FIG. 4 by etching the ruthenium hard mask layer 115.

The use of a BARC layer 110 over the ruthenium hard mask layer 115 is advantageous as plasma etch chemistries that are often used to etch BARC layers will not readily etch ruthenium. Further, plasma chemistries that may be used to etch ruthenium include, for example but not limited to, oxygen (O2) based plasma etches and/or chlorine (Cl2) containing oxygen based plasma etches. Such O2 and Cl2 based plasma etches do not readily etch traditional BARC materials, including BARC materials containing silicon, oxides, nitrides or combinations thereof. Further, such ruthenium etches also provide selectivity to typical underlying target etch layers such as target etch layer 120 which often may be formed of an oxide, nitride, low-k dielectric or combinations thereof. In this manner, the use of a ruthenium hard mask provides high selectivity to both BARC materials and target etch layer materials, thereby being advantageously useful as a hard mask layer for a stack of layers utilized to pattern a substrate such as shown in FIGS. 1-7. As shown in FIG. 4, the photoresist may be removed. Such removal may be a separate process step or may be a result of the plasma etch used to etch the ruthenium hard mask layer 115.

Figure 5:
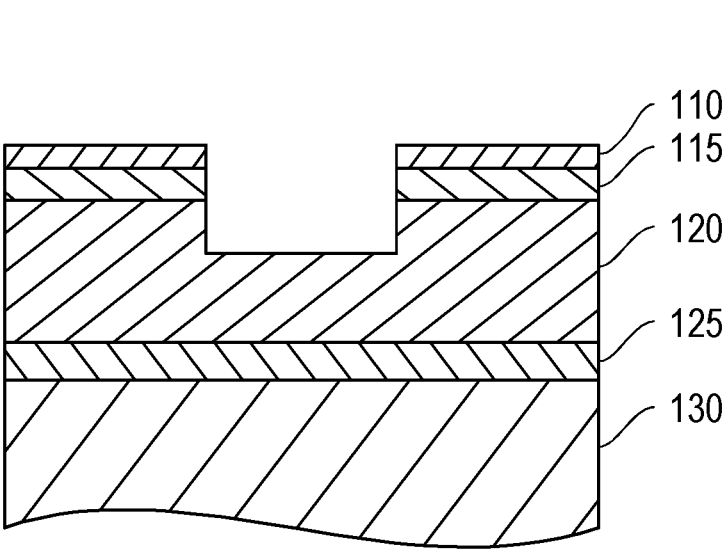
Figure 5:
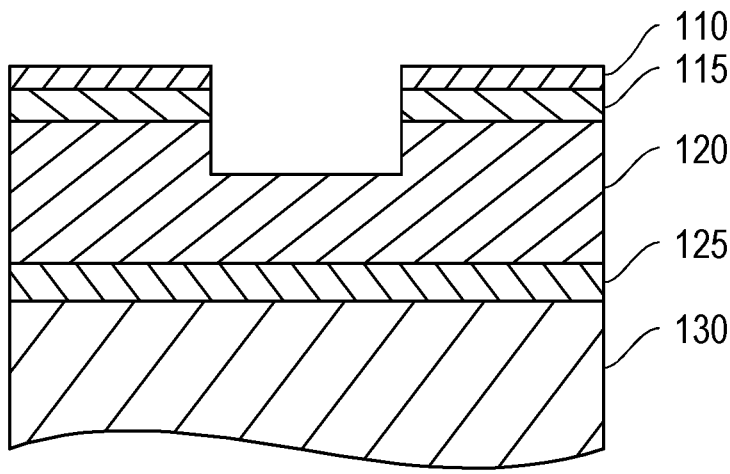

The process flow may next proceed to the stage shown in FIG. 5.

Figure 6:
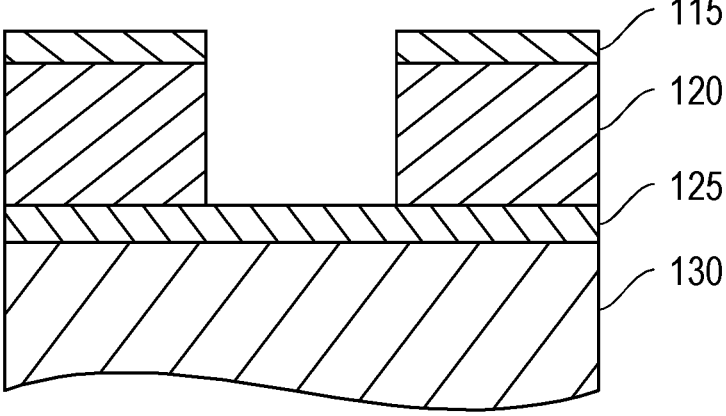
Figure 6:
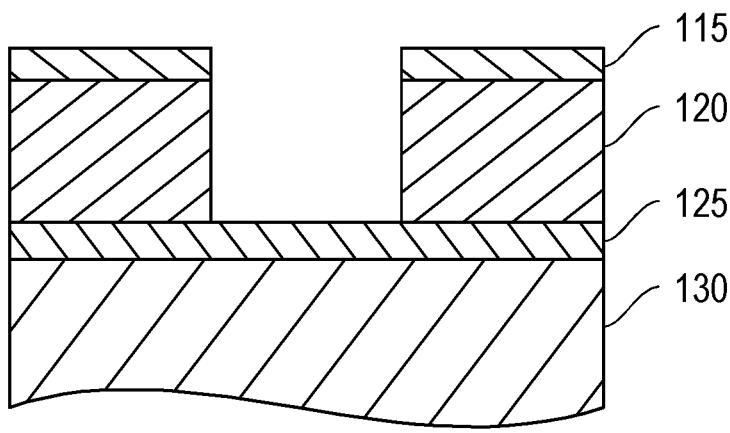

As shown in FIG. 5, etching of the target etch layer 120 has commenced. An exemplary etch for etching such a layer may be a halogen based plasma etch. It is noted though, that such an etch may also etch the BARC layer 110. Thus, as shown in FIG. 5, as the target etch layer 120 is etched, the BARC layer 110 may also be etched (as shown in FIG. 5 the BARC layer 110 is thinned). FIG. 6 illustrates the completion of the etch of the target etch layer 120 and the BARC layer 110 being completely removed.

As shown in FIG. 6, the etch of the target etch layer 120 may stop on an etch stop layer 125, however it will be recognized that the use of etch stop layer 125 may be optional. The use of a ruthenium hard mask layer is advantageous in that etches which may etch typical target etch layer materials are selective to ruthenium, thus providing good hard mask properties when etching the target etch layer 120.

Figure 7:
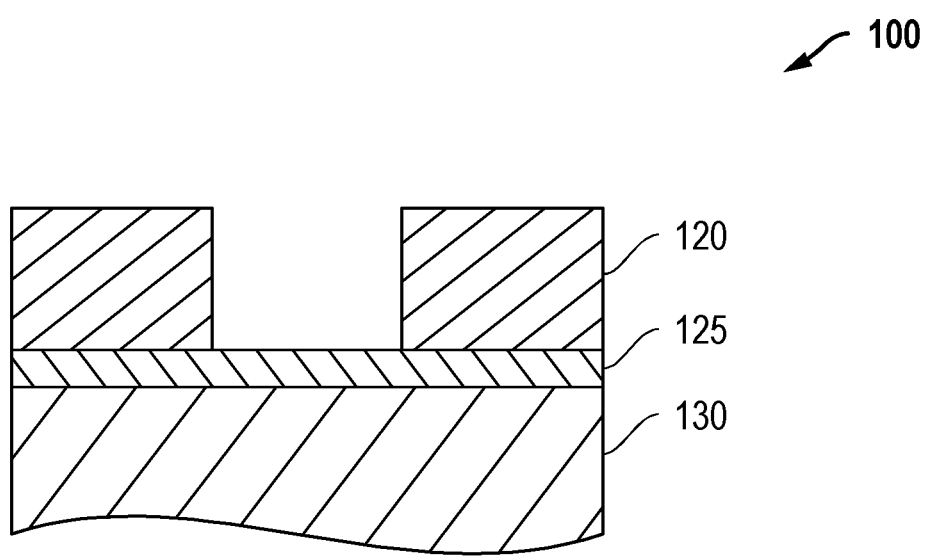

Finally, as shown in FIG. 7, the ruthenium hard mask layer 115 may be removed.

The process to remove the ruthenium hard mask layer 115 may be an O2 plasma based process. As such plasmas typically do not impact the materials of the surrounding layers that are exposed at this point in the process (for example typical target etch layers), the removal process may be performed in a manner that does not significantly impact the pattern that has been formed in the target etch layer 120.

Thus as can be seen, the use of a ruthenium hard mask provides a number of advantages. The high selectivity of ruthenium to the etches used to etch the other layers of the substrate allows the ruthenium hard mask layer to be a relatively thin layer. In this manner, aspect ratio etching effects are minimized and any isotropic etching of the ruthenium hard mask layer will have minimal impact. Further, the plasma etches used to etch and the plasmas used to remove the ruthenium hard mask layer do not significantly impact the other surrounding layers. Finally, the typical etches used to etch the target etch layer do not appreciably etch ruthenium. In this manner, a hard mask layer for use with small geometry pitch structures may advantageously be a layer that comprises ruthenium.

It will be recognized that the ruthenium hard mask usage described herein may be used in a wide variety of process flows, with a wide variety of surrounding process layers of varying compositions and thicknesses and with a wide variety of etch processes. In one exemplary process flow, in addition to a ruthenium hard mask, at least one additional layer is located between the target etch layer and a patterned layer. In one embodiment, the patterned layer is a photoresist layer of between 30 to 500 nm, and more preferably 50 nm. In one exemplary embodiment, the additional layer is a BARC material comprised of silicon nitride and having a thickness of 5 to 100 nm, and more preferably 20 nm. In one exemplary embodiment a ruthenium hard mask layer having a thickness of 10 nm and a target etch layer of silicon having a thickness of 200 nm may be utilized. Further, a CF4 etch may be used to etch the BARC material, a plasma process utilizing oxygen may be used to etch the ruthenium hard mask and an argon/CF4 etch may be utilized to etch the target etch layer, which may be for example a back end of line processing layer. It will be recognized, that such materials, thicknesses and etches are merely exemplary and the advantages of the ruthenium hard mask layer is not limited to such examples.

In one embodiment, the ruthenium layer may be ruthenium free of contaminants. However, it will be recognized that a ruthenium layer containing other materials (for example carbon) as long as the layer can be properly removed (for example with an oxygen plasma). Any of a wide variety of techniques may be utilized to form the ruthenium. For example, atomic layer deposition processes, sputtering processes, chemical vapor deposition processes, etc. may be utilized. In one example, the ruthenium layer is formed by the use of ruthenium containing precursors or their derivatives in a plasma vapor deposition process. It will be recognized that other processes may be utilized as the techniques described herein are not limited to specific techniques for forming the ruthenium layer.

Though described herein with regard to a ruthenium layer, it will be recognized that the hard mask layer described herein may comprise ruthenium combined with other materials. Thus, as described herein a hard mask layer comprises ruthenium, but the hard mask layer is not limited to only being ruthenium. For example, the ruthenium layer may be a layer comprised of ruthenium and phosphorus.

Figure 8:
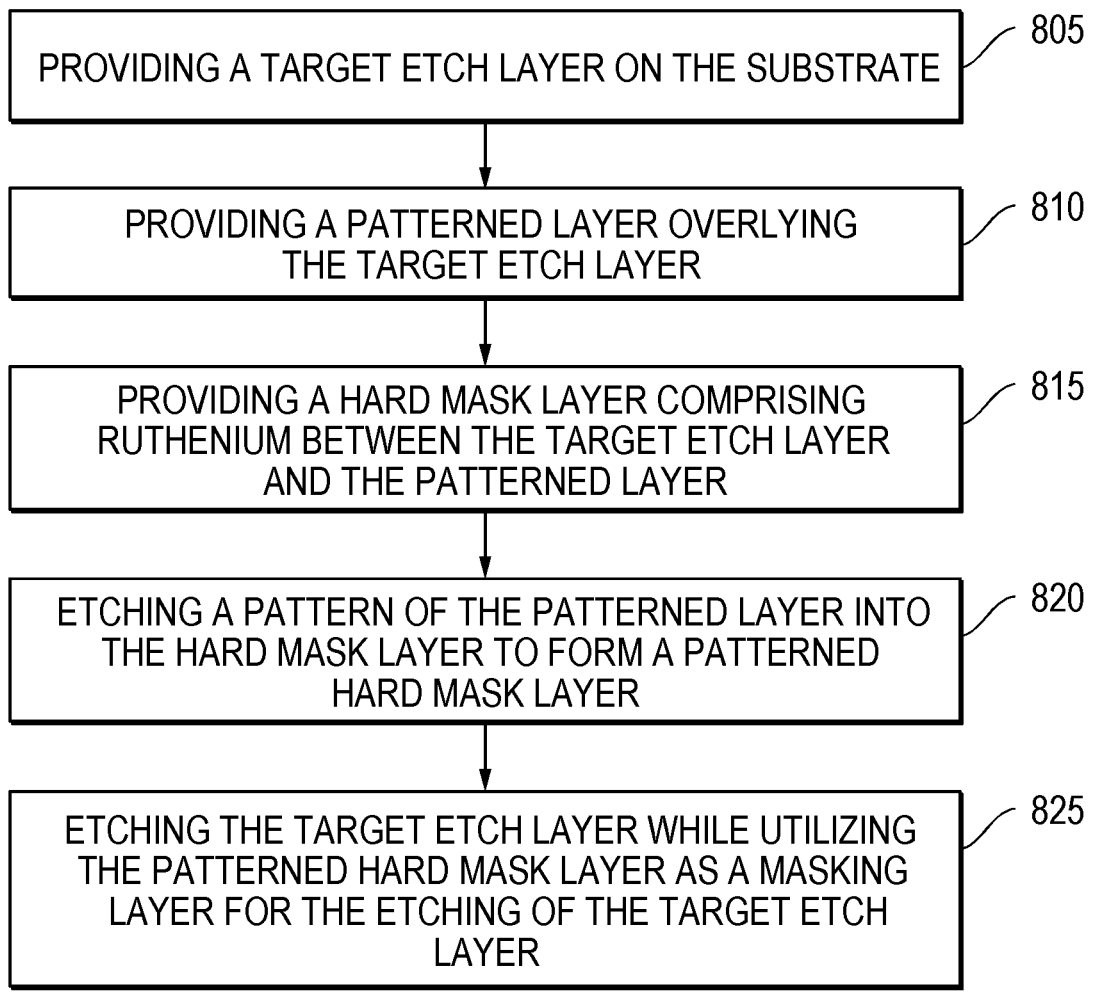
FIGS. 8-10 illustrate additional exemplary process flows utilizing the techniques described herein.
Figure 9:
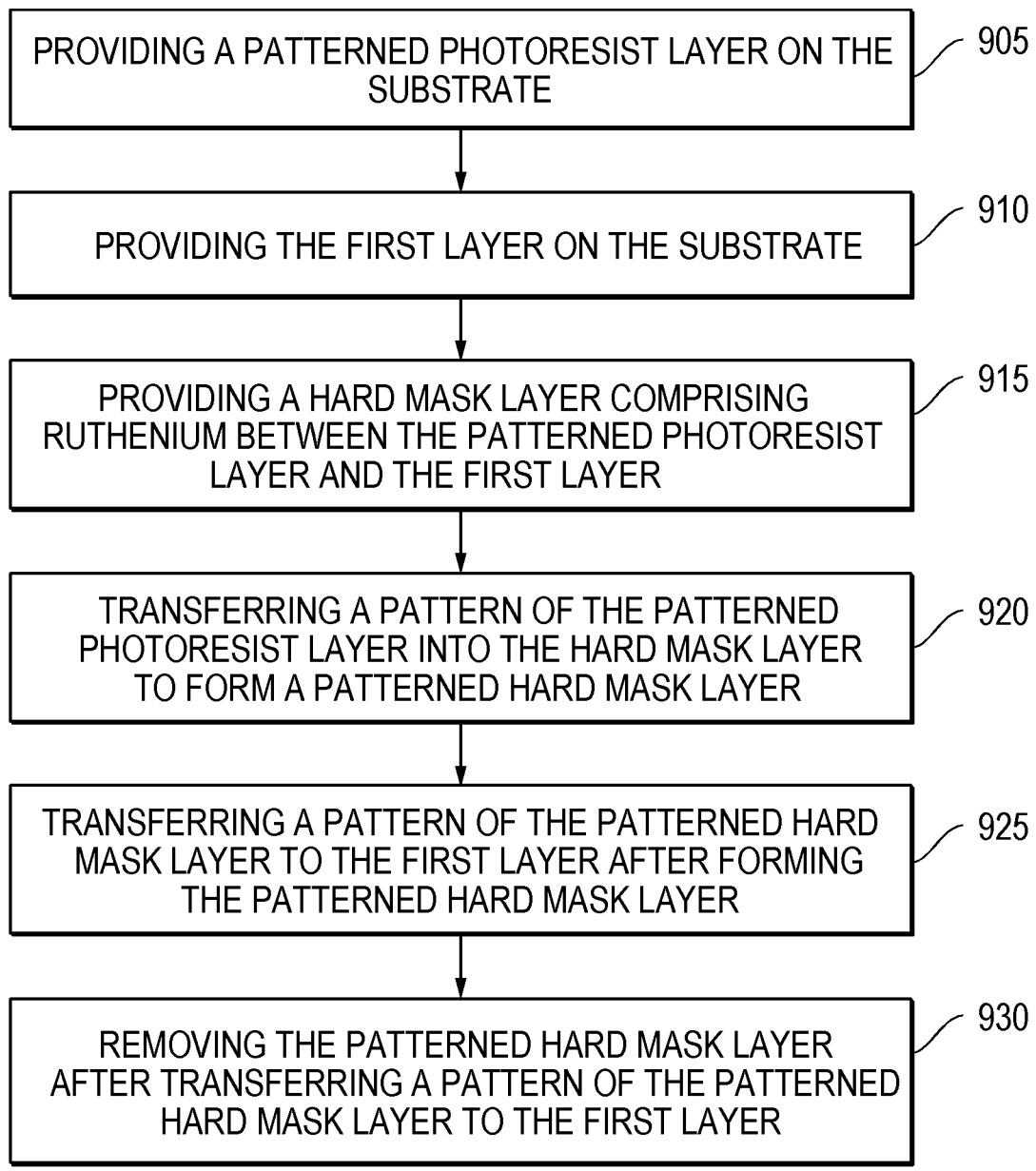
Figure 10:
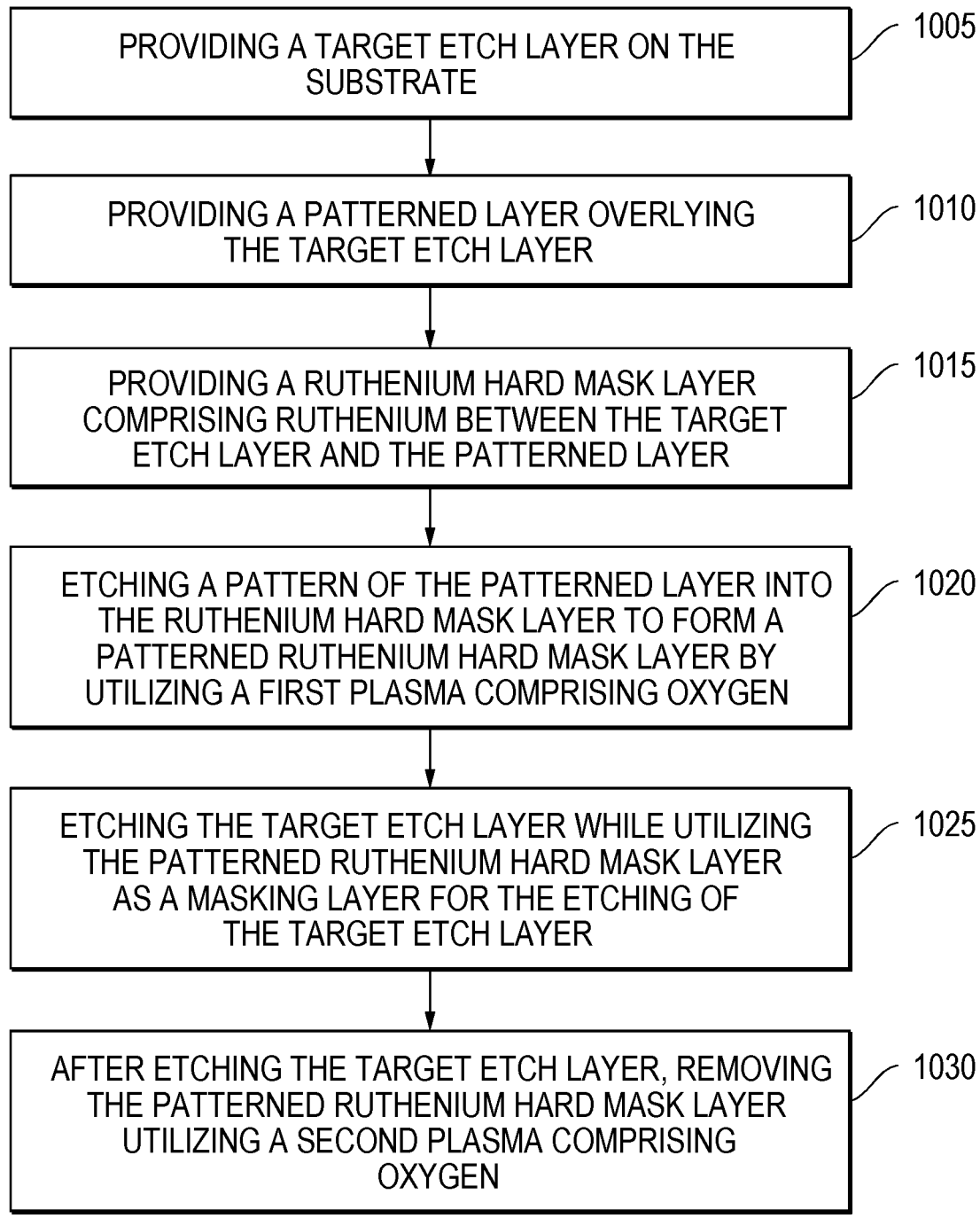

FIGS. 8-10 illustrate exemplary methods for use of the processing techniques described herein. It will be recognized that the embodiments of FIGS. 8-10 are merely exemplary and additional methods may utilize the techniques described herein. Further, additional processing steps may be added to the methods shown in the FIGS. 8-10 as the steps described are not intended to be exclusive. Moreover, the order of the steps is not limited to the order shown in the figures as different orders may occur and/or various steps may be performed in combination or at the same time In FIG. 8, a method of etching a substrate is illustrated. The method may comprise step 805 of providing a target etch layer on the substrate and step 810 of providing a patterned layer overlying the target etch layer. The method further includes step 815 of providing a hard mask layer comprising ruthenium between the target etch layer and the patterned layer. The method then includes step 820 of etching a pattern of the patterned layer into the hard mask layer to form a patterned hard mask layer. The method further includes step 825 of etching the target etch layer while utilizing the patterned hard mask layer as a masking layer for the etching of the target etch layer.

In FIG. 9, a method of patterning a first layer of a substrate is shown. The method comprises step 905 of providing a patterned photoresist layer on the substrate, step 910 of providing the first layer on the substrate, and step 915 of providing a hard mask layer comprising ruthenium between the patterned photoresist layer and the first layer. The method further includes step 920 of transferring a pattern of the patterned photoresist layer into the hard mask layer to form a patterned hard mask layer. The method also includes step 925 of transferring a pattern of the patterned hard mask layer to the first layer after forming the patterned hard mask layer. Finally, the method includes step 930 of removing the patterned hard mask layer after transferring a pattern of the patterned hard mask layer to the first layer.

In FIG. 10, a method of etching a substrate is shown. The method comprises step 1005 of providing a target etch layer on the substrate, step 1010 of providing a patterned layer overlying the target etch layer, and step 1015 of providing a ruthenium hard mask layer comprising ruthenium between the target etch layer and the patterned layer. The method further comprises step 1020 of etching a pattern of the patterned layer into the ruthenium hard mask layer to form a patterned ruthenium hard mask layer by utilizing a first plasma comprising oxygen. The method also includes step 1025 of etching the target etch layer while utilizing the patterned ruthenium hard mask layer as a masking layer for the etching of the target etch layer. After etching the target etch layer, the method includes step 1030 of removing the patterned ruthenium hard mask layer utilizing a second plasma comprising oxygen.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of etching a substrate, the method comprising:

providing a target etch layer on the substrate;

providing a patterned layer overlying the target etch layer;
providing a hard mask layer comprising ruthenium between the target etch layer and the patterned layer;
providing an additional layer between the target etch layer and the patterned layer;
etching a pattern of the patterned layer into the hard mask layer to form a patterned hard mask layer;
etching the target etch layer while utilizing the patterned hard mask layer as a masking layer for the etching of the target etch layer; and
removing all remnants of the additional layer during the etching of the target etch layer,
wherein the hard mask layer is 15 nm thick or less.

2. The method of claim 1, wherein the additional layer is an anti-reflective layer.

3. The method of claim 2, wherein the anti-reflective layer is a bottom anti-reflective coating layer located between the hard mask layer and the patterned layer.

4. The method of claim 3, wherein the patterned layer is a photoresist layer.

5. The method of claim 1, further comprising removing all remnants of the patterned layer while etching the pattern of the patterned layer into the hard mask layer to form the patterned hard mask layer.

6. The method of claim 1, wherein
the hard mask layer is provided directly on top of the target etch layer,
the additional layer is a homogeneous layer and is provided directly on top of the ruthenium hard mask layer, and
the patterned layer is provided directly on top of the additional layer.

7. The method of claim 6, further comprising:
providing an etch stop layer on the substrate,
wherein the target etch layer is provided directly on top of the etch stop layer.

8. A method of patterning a first layer of a substrate, the method comprising:
providing a patterned photoresist layer on the substrate;
providing the first layer on the substrate;
providing a hard mask layer comprising ruthenium between the patterned photoresist layer and the first layer;
providing an anti-reflective layer between the patterned photoresist layer and the first layer;
transferring a pattern of the patterned photoresist layer into the hard mask layer to form a patterned hard mask layer;
transferring a pattern of the patterned hard mask layer to the first layer after forming the patterned hard mask layer;
removing all remnants of the anti-reflective layer while transferring the pattern of the patterned hard mask layer to the first layer; and
removing the patterned hard mask layer after transferring the pattern of the patterned hard mask layer to the first layer,
wherein the hard mask layer is 15 nm thick or less.

9. The method of claim 8, wherein the transferring the pattern of the patterned photoresist layer into the hard mask layer is performed using a plasma etch.

10. The method of claim 8, wherein the transferring the pattern of the patterned hard mask layer to the first layer is performed using a plasma etch.

11. The method of claim 8, wherein the removing the patterned hard mask layer is performed using a plasma process utilizing oxygen.

12. The method of claim 11, wherein the transferring the pattern of the patterned hard mask layer to the first layer is performed using a plasma etch.

13. The method of claim 12, wherein the anti-reflective layer is a bottom anti-reflective coating layer between the patterned photoresist layer and the hard mask layer.

14. The method of claim 12, wherein the substrate is a semiconductor wafer at a back end of line processing point or a front end of line processing point.

15. A method of etching a substrate, the method comprising:
providing a target etch layer on the substrate;
providing a patterned layer overlying the target etch layer;
providing a ruthenium hard mask layer comprising ruthenium between the target etch layer and the patterned layer;
providing an anti-reflective layer between the patterned layer and the target etch layer;
etching a pattern of the patterned layer into the ruthenium hard mask layer to form a patterned ruthenium hard mask layer by utilizing a first plasma comprising oxygen;
etching the target etch layer while utilizing the patterned ruthenium hard mask layer as a masking layer for the etching of the target etch layer;
while etching the target etch layer, removing all remnants of the anti-reflective layer; and
after etching the target etch layer, removing the patterned ruthenium hard mask layer utilizing a second plasma comprising oxygen,
wherein the ruthenium hard mask layer is 15 nm thick or less.

16. The method of claim 15, wherein the patterned layer is a photoresist layer.

17. The method of claim 16, wherein the anti-reflective layer is provided between the photoresist layer and the ruthenium hard mask layer.

18. The method of claim 17, wherein the substrate is a semiconductor substrate.

19. The method of claim 18, wherein the target etch layer is a back end of line processing layer or a front end of line processing layer.

20. The method of claim 15, wherein
the patterned layer is a photoresist layer, and
the anti-reflective layer is provided between the photoresist layer and the ruthenium hard mask layer.

21. The method of claim 15, wherein the ruthenium hard mask layer comprises ruthenium, ruthenium and carbon, or ruthenium and phosphorus.

* * * * *